US008138792B2

(12) United States Patent
Chang et al.

(10) Patent No.: US 8,138,792 B2
(45) Date of Patent: Mar. 20, 2012

(54) GATE DRIVE CIRCUIT, DISPLAY SUBSTRATE HAVING THE SAME, AND METHOD THEREOF

(75) Inventors: Jong-Woong Chang, Cheonan-si (KR); Kweon-Sam Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 989 days.

(21) Appl. No.: 12/114,882

(22) Filed: May 5, 2008

(65) Prior Publication Data

US 2009/0115690 A1 May 7, 2009

(30) Foreign Application Priority Data

Nov. 1, 2007 (KR) ........................ 10-2007-0110828

(51) Int. Cl.
*H01L 25/00* (2006.01)

(52) U.S. Cl. ............................. 326/47; 326/41; 326/101

(58) Field of Classification Search .............. 326/82–87, 326/37–41, 47, 101; 345/98–100, 87, 204; 377/64, 79

See application file for complete search history.

(56) References Cited

U.S. PATENT DOCUMENTS

2006/0061562 A1* 3/2006 Park et al. ..................... 345/204
2008/0012816 A1* 1/2008 Moon ........................... 345/100
2008/0048712 A1* 2/2008 Ahn et al. ....................... 326/21

* cited by examiner

*Primary Examiner* — Shawki S Ismail
*Assistant Examiner* — Thienvu Tran
(74) *Attorney, Agent, or Firm* — Cantor Colburn LLP

(57) ABSTRACT

A gate drive circuit includes a shift register, a clock wiring and a start wiring. The shift register includes a plurality of stages arranged in a first direction on a base substrate to output a plurality of gate signals. The clock wiring is extended along the first direction. The clock wiring is electrically connected to a plurality of clock connecting wirings extended in a second direction crossing the first direction to deliver a clock signal to the stages. The start wiring includes the first wiring extended along the first direction and a second wiring connected to the first wiring and extended in the first direction to cross with the clock connecting wirings so as to deliver a vertical start signal to a first stage. Therefore, a structure of a signal wiring delivering a vertical start signal is changed, thereby protecting the gate drive circuit from static electricity.

21 Claims, 6 Drawing Sheets

GATE DRIVE CIRCUIT, DISPLAY SUBSTRATE HAVING THE SAME, AND METHOD THEREOF

This application claims priority to Korean Patent Application No. 2007-110828, filed on Nov. 1, 2007, and all the benefits accruing therefrom under 35 U.S.C. §119, the contents of which in its entirety are herein incorporated by reference.

BACKGROUND OF THE INVENTION

1. Field of the Invention

The present invention relates to a gate drive circuit, a display substrate having the gate drive circuit, and a method thereof. More particularly, the present invention relates to a gate drive circuit capable of enhancing reliability, a display substrate having the gate drive circuit, and a method of enhancing reliability of the display substrate.

2. Description of the Related Art

Generally, a plurality of display cells is formed on a mother substrate, and then the mother substrate is separated into a plurality of display substrates through an array test process and a scrap process.

A plurality of test pads for performing the array test process for each of the display cells is formed in the mother substrate. The test pads are electrically connected to a plurality of data lines and a plurality of gate lines that are formed on each of the display cells. The test pads include a plurality of test pads applying a data test signal to the data lines and a plurality of gate test pads applying a gate test signal to the gate lines.

Recently, a display substrate having a gate drive circuit for driving the gate lines integrated thereon has been developed. The gate drive circuit includes a plurality of stages outputting a gate signal to the gate lines. When the gate drive circuit is integrated on the display substrate, a plurality of drive signals for driving the gate drive circuit is applied to the gate test pads.

The drive signals include a power signal VSS, a plurality of clock signals CK and CKB, and a vertical start signal STV. The power and clock signals VSS, CK, and CKB are provided to each of the stages of the drive circuit. The vertical start signal STV is provided to a first stage of the stages to initiate a driving of the gate drive circuit.

Static electricity, which is generated during a manufacturing process of the mother substrate or an array test process, is applied to a pad receiving the vertical start signal STV so that the static electricity damages a first stage of the gate drive circuit. As the first stage of the gate drive circuit is operated, the remaining stages are sequentially operated. As a result, when the first stage is damaged by the static electricity, the gate drive circuit is not operated.

BRIEF SUMMARY OF THE INVENTION

The present invention provides a gate drive circuit capable of enhancing a tolerance for static electricity.

The present invention also provides a display substrate having the above-mentioned gate drive circuit.

The present invention also provides a method of enhancing a tolerance for static electricity in a display substrate.

In exemplary embodiments of the present invention, a gate drive circuit includes a shift register, a clock wiring and a start wiring. The shift resister includes a plurality of stages arranged in a first direction on a base substrate to output a plurality of gate signals. The clock wiring is extended along the first direction. The clock wiring is electrically connected to a plurality of clock connecting wirings extended in a second direction crossing the first direction to deliver a clock signal to the stages. The start wiring includes a first wiring extended along the first direction and a second wiring connected to the first wiring and extended in the first direction to cross with the clock connecting wirings so that a vertical start signal is delivered to a first stage among the stages.

In other exemplary embodiments of the present invention, a display substrate includes a plurality of pixel parts and a gate drive circuit. The pixel parts are formed in a display area of a base substrate. The pixel parts are electrically connected to a plurality of data lines extended along a first direction and a plurality of gate lines extended along a second direction crossing the first direction. The gate drive circuit includes a shift register, a clock wiring and a start wiring. The shift register is formed at a peripheral area surrounding the display area. The shift register includes a plurality of stages to output a plurality of gate signals. The clock wiring is electrically connected to a plurality of clock connecting wirings extended along the second direction to deliver a clock signal to the stages. The start wiring includes a first wiring extended along the first direction and a second wiring connected to the first wiring and extended in the first direction to cross with the clock connecting wirings so as to deliver a vertical start signal to a first stage among the stages.

In still other exemplary embodiments of the present invention, a method of enhancing a driving reliability of a gate drive circuit, the gate drive circuit including a shift register including a plurality of stages arranged in a first direction on a base substrate to output a plurality of gate signals, and a clock wiring extended along the first direction, the clock wiring electrically connected to a plurality of clock connecting wirings extended in a second direction crossing the first direction to deliver a clock signal to the stages, includes providing a start wiring to deliver a vertical start signal to a first stage among the stages, the start wiring including a first wiring extended along the first direction and a second wiring connected to the first wiring and extended along the first direction, and crossing the second wiring of the start wiring with the clock connecting wirings, wherein capacitors are formed where the second wiring crosses the clock connecting wirings, and static electricity applied to the start wiring is dispersed through the capacitors to decrease energy of static electricity applied to the shift register.

According to a gate drive circuit, a display substrate having the gate drive circuit, and a method thereof, a structure of a signal wiring delivering a vertical start signal is changed, thereby protecting the gate drive circuit from static electricity. Therefore, a driving reliability of a display device may be enhanced.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
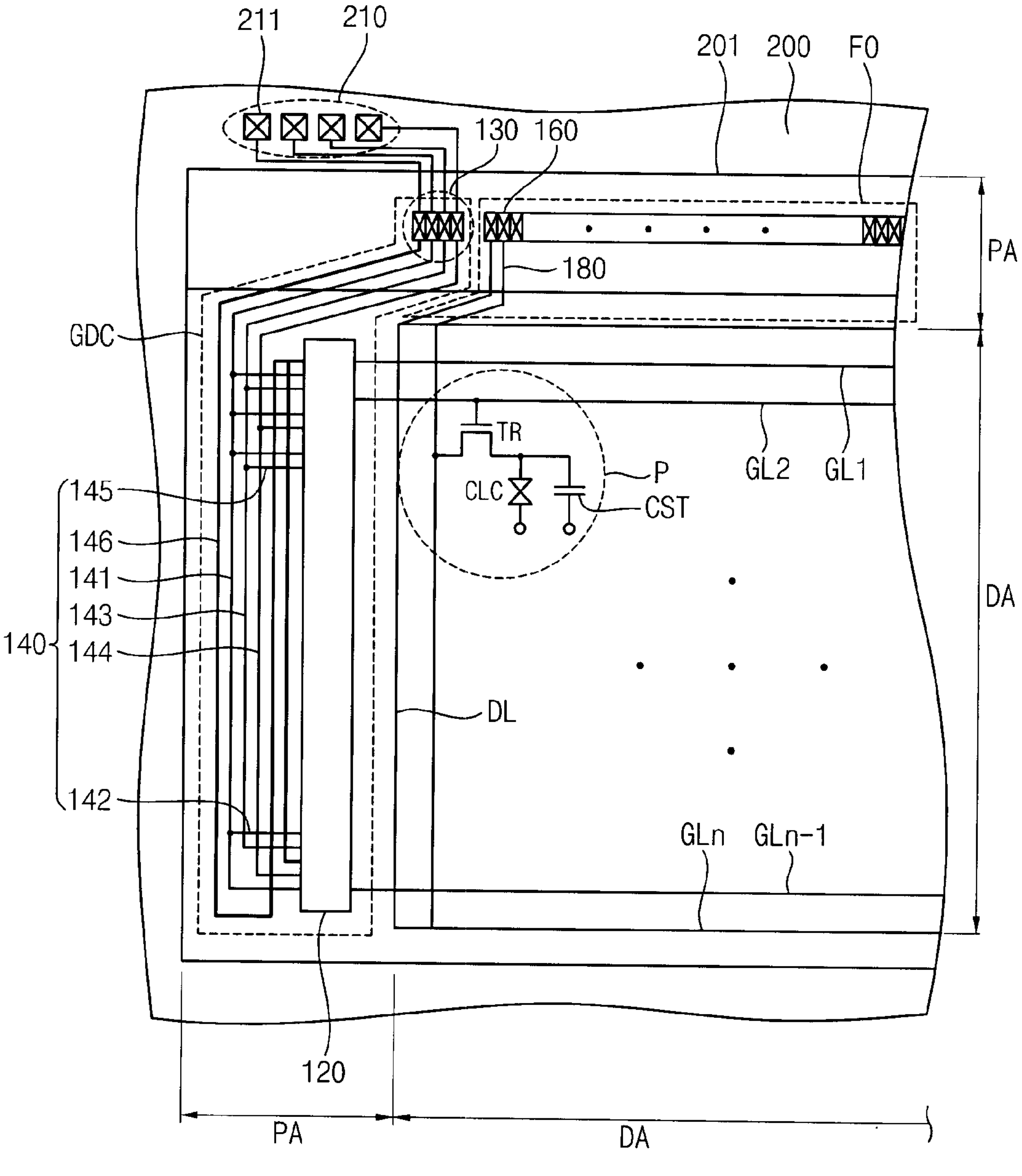
FIG. 1 is a plan view illustrating an exemplary display substrate according to one exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view illustrating an exemplary display substrate according to one exemplary embodiment of the present invention.

Referring to FIG. 1, a display substrate (a partial section of which is shown in FIG. 1) is formed in a mother substrate 200.

The display substrate includes a display area DA having a plurality of pixel parts P, and a peripheral area PA that surrounds the display area DA.

A plurality of data lines DL, a plurality of gate lines GL1 to GLn (wherein, 'n' is a natural number), and the pixel parts P are formed on the display area DA. The data lines DL are extended along a first direction, and the gate lines GL1 to GLn are extended along a second direction crossing the first direction. The second direction may be substantially perpendicular to the first direction. The pixel parts P are electrically connected to the gate lines GL1 to GLn and data lines DL, respectively. Each of the pixel parts P includes a switching element TR electrically connected to one of the gate lines GL1 to GLn and one of the data lines DL, a liquid crystal capacitor CLC electrically connected to the switching element TR and a storage capacitor CST electrically connected to the switching element TR.

A gate drive circuit GDC and a fan out part FO are formed at the peripheral area PA. The gate drive circuit GDC is formed adjacent to end portions of the gate lines GL1 to GLn, and includes a shift register 120, a signal pad part 130 and a signal wiring part 140.

The shift register 120 includes a plurality of stages electrically connected to end portions of the gate lines GL1 to GLn, respectively, to output a plurality of gate signals to the gate lines GL1 to GLn.

Figure 2:
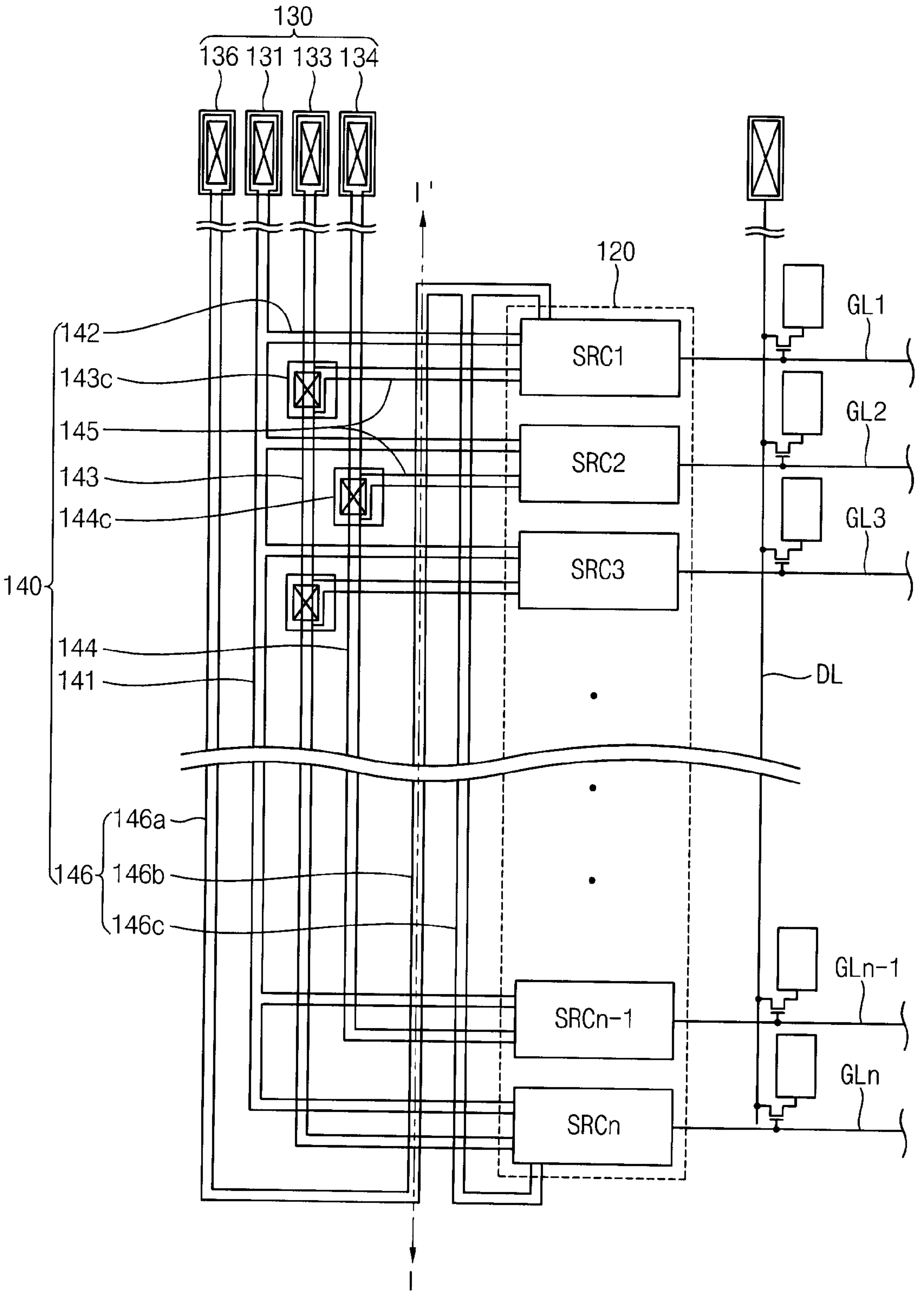
FIG. 2 is an enlarged view illustrating the exemplary gate drive circuit of FIG. 1.

The signal pad part 130 receives a plurality of drive signals driving the shift register 120. The drive signals include a power signal VSS, a first clock signal CK, a second clock signal CKB and a vertical start signal STV. Therefore, as shown in FIG. 2, the signal pad part 130 includes a power pad 131 receiving the power signal VSS, a first clock pad 133 receiving the first clock signal CK, a second clock pad 134 receiving the second clock signal CKB, and a start pad 136 receiving the vertical start signal STV.

The signal wiring part 140 delivers the drive signals applied to the signal pad part 130 to the shift register 120. For example, the signal wiring part 140 includes a power wiring 141 delivering the power signal VSS, a first clock wiring 143 delivering the first clock signal CK, a second clock wiring 144 delivering the second clock signal CKB and a start wiring 146 delivering the vertical start signal STV.

The power wiring 141 is extended along the first direction, such as substantially parallel to the data lines DL. The signal wiring part 140 includes a plurality of power connecting wirings 142 that extend along the second direction, such as substantially parallel to the gate lines GL1 to GLn, crossing the first direction to connect the power wiring 141 to power terminals of the stages, respectively.

The first and second clock wirings 143 and 144 are extended along the first direction in parallel with the power wiring 141. The signal wiring part 140 includes a plurality of clock connecting wirings 145 that extend along the second direction to connect the first and second clock wirings 143 and 144 to clock terminals of the stages.

As will be further described below with respect to FIG. 2, the start wiring 146 includes a first wiring, and a second wiring. The first wiring is extended from a first stage connected to a first gate line GL1 to an (n)-th stage connected to an (n)-th gate line GLn. The second wiring is connected to the first wiring and is extended from the (n)-th stage to the first stage. That is, the start wiring 146 has a U-shape to be connected to an input terminal of the first stage. The second wiring extended along the first direction crosses the power connecting wirings 142 and the clock connecting wirings 145. The second wiring may define a plurality of capacitors in the crossed portions. The capacitors are connected to the start wiring 146. Therefore, static electricity applied to the start wiring 146 is dispersed through the capacitors, so that the first stage may be protected from the static electricity.

The fan out part FO includes a data pad part 160 including a plurality of data pads, and an output wiring part 180 including a plurality of output wirings connecting to the data pads and the data lines DL.

The data pad part 160 is electrically connected to a flexible printed circuit board ("PCB") to receive a plurality of data signals from a data drive circuit (not shown). The output wiring part 180 delivers the data signals that are applied to the data pad part 160 to the data lines DL.

A division line 201 defining the display substrate, and an array test pad part adjacent to the division line 201 are formed on the mother substrate 200. The array test pad part includes a gate test pad part 210, a data test pad part (not shown), and a common voltage pad part (not shown). The gate test pad part 210 receives the gate test signal during the array test process, and provides the shift register 120 with the gate test signal. The gate test pad part 210 includes a start test pad 211 receiving the vertical start signal STV.

When static electricity is applied to the gate test pad part 210, which is generated during a manufacturing process of the display substrate on the mother substrate 200 or an array test process, the signal wiring part 140 may disperse the static electricity to protect the shift register 120 from being damaged by the static electricity.

For example, when static electricity is applied to the start test pad 211, the static electricity is applied to first and second wirings of the start wiring 146, and the static electricity applied to the second wiring is dispersed by the capacitors formed in the crossed portions of the second wiring and the power and clock connecting wirings 142 and 145 to decrease the static electricity. Therefore, the shift register 120 is prevented from being damaged by the static electricity.

Moreover, the static electricity applied to the voltage wiring 141, a first clock wiring 143 and a second clock wiring 144 is dispersed by the power and clock connecting wirings 142 and 145 so as to be decreased. Therefore, the shift register 120 is prevented from being damaged.

FIG. 2 is an enlarged view illustrating the exemplary gate drive circuit of FIG. 1.

Referring to FIGS. 1 and 2, the gate drive circuit GDC includes a shift register 120, a signal pad part 130 and a signal wiring part 140.

The shift register 120 includes n numbers of stages SRC1 to SRCn (wherein, 'n' is a natural number) that are connected to each other. For example, a second stage SRC2 is connected to a first stage SRC1 and a third stage SRC3. The second stage SRC2 outputs a high level of a second gate signal based on a high level of a first gate signal from the first stage SRC1, and maintains a low level of the second gate signal based on a high level of a third gate signal provided from the third stage SRC3.

The signal pad part 130 receives a plurality of drive signals to be provided to the shift register 120. The signal pad part 130 includes a power pad 131, a first clock pad 133, a second clock pad 134 and a start pad 136. The power pad 131 receives a power voltage VSS, the first clock pad 133 receives a first clock signal CK, the second clock pad 134 receives a second clock signal CKB, and the start pad 136 receives a vertical start signal STV.

The signal wiring part 140 delivers a plurality of drive signals received from the signal pad part 130 to the shift register 120. The signal wiring part 140 includes a power wiring 141, a power connecting wiring 142, a first clock wiring 143, a second clock wiring 144, a clock connecting wiring 145 and a start wiring 146.

The power wiring 141 is extended from the power pad 131 in a first direction parallel with the data line DL to deliver the power voltage VSS. The power connecting wiring 142 is extended from the power wiring 141 in a second direction crossing the first direction to be connected to power terminals of each of the stages, respectively. Thus, the power signal VSS sent by the power pad 131 may be provided to the stages SRC1 to SRCn. In an exemplary embodiment, the power wiring 141 and the power connecting wiring 142 are formed from the same material as a metal material. Alternatively, the power wiring 141 and the power connecting wiring 142 may be formed from different metal materials.

The first and second clock wirings 143 and 144 are formed between the power wiring 141 and the shift register 120, and are extended along the first direction to deliver the first and second clock signals CK and CKB from the first and second clock pads 133, 134. The clock connecting wiring 145 is extended from the first and second clock wirings 143 and 144 in the second direction to be connected to clock terminals of each of the stages, respectively.

For example, the clock connecting wiring 145 connected to the first clock wiring 143 through a first contact portion 143*c* is connected to a clock terminal of odd numbered stages SRC1, SRC3, . . . , SRCn−1. The clock connecting wiring 145 connected to the second clock wiring 144 through a second contact portion 144*c* is connected to a clock terminal of even numbered stages SRC2, SRC4, . . . , SRCn. Therefore, the first clock signal CK applied to the first clock pad 133 is provided to the odd numbered stages SRC1, SRC3, . . . , SRCn−1, and the second clock signal CKB applied to the second clock pad 134 is provided to the even numbered stages SRC2, SRC4, . . . , SRCn. The first clock signal CK may have a phase opposite to the second clock signal CKB.

The start wiring 146 includes a first wiring 146*a* extended in the first direction adjacent to the power wiring 141, and a second wiring 146*b* and a third wiring 146*c* that are extended in the first direction between the first and second clock wirings 143 and 144 and the shift register 120.

For example, the first wiring 146*a* may be formed in a first side opposite to a second side of the power wiring 141, where the first and second clock wirings 143 and 144 are adjacent to the second side of the power wiring 141, and the first wiring 146*a* may be extended from the start pad 136 to an (n)-th stage SRCn.

The second and third wirings 146*b* and 146*c* are crossed with the power connecting wiring 142 and the clock connecting wiring 145. The second wiring 146*b* is connected to the first wiring 146*a*, such as at an end that is opposite the end connected to the start pad 136, and is extended from the (n)-th stage SRCn to the first stage SRC1 to be connected to an input terminal of the first stage SRC1. The third wiring 146*c* is connected to the second wiring 146*b*, such as at an end that is adjacent to the first stage SRC1, and is extended from the first stage SRC1 to the (n)-th stage SRCn to be connected to an input terminal of the (n)-th stage SRCn. The first wiring 146*a* may be connected to the second wiring 146*b* by a connecting wiring that extends in the second direction and disposed near an end of the display substrate adjacent to the (n)-th stage SRCn. Therefore, the vertical start signal STV applied to the start pad 136 is provided to the first and (n)-th stages SRC1 and SRCn.

A plurality of capacitors is formed in crossed portions between the second and third wirings 146*b* and 146*c*, the power connecting wiring 142 and the clock connecting wiring 145. Therefore, static electricity applied to the start wiring 146 is dispersed by the capacitors, thereby preventing damage to the shift register 120.

Figure 3:
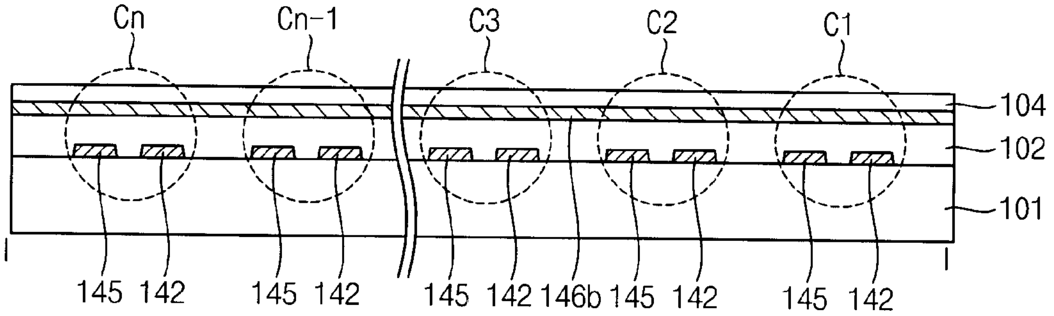
FIG. 3 is a cross-sectional view taken along line I-I' of FIG. 2.
Figure 4:
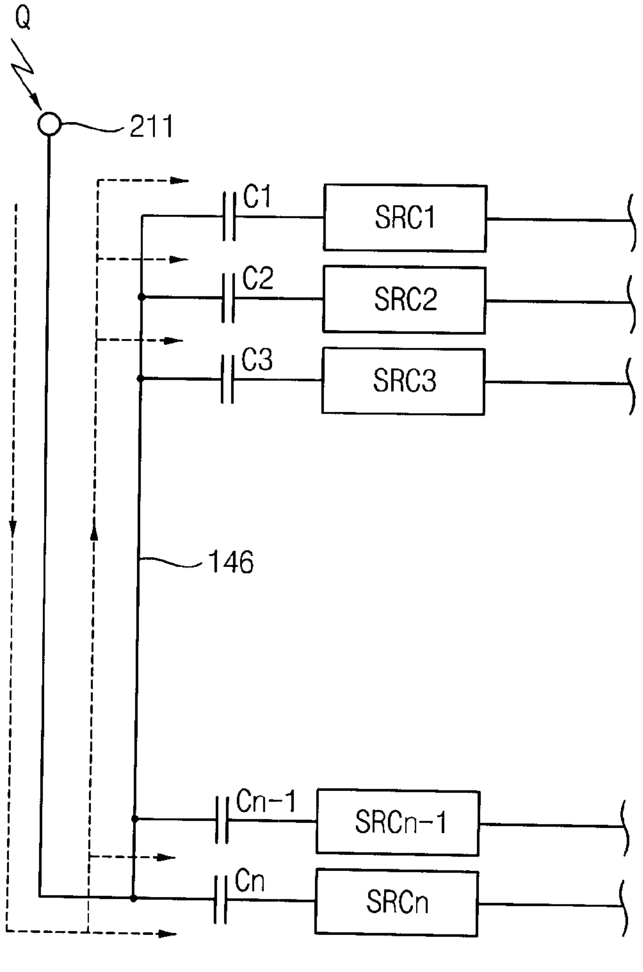
FIG. 4 is an equivalent circuit diagram illustrating the exemplary start wiring of FIG. 2.

FIG. 3 is a cross-sectional view taken along line I-I' of FIG. 2. FIG. 4 is an equivalent circuit diagram illustrating the exemplary start wiring of FIG. 2.

Referring to FIGS. 2 to 4, a second wiring 146*b* of the start wiring 146 is crossed with the power connecting wiring 142 and the clock connecting wiring 145.

For example, the power connecting wiring 142 and the clock connecting wiring 145 may be formed from a first metal layer formed on a base substrate 101. The first metal layer may be substantially identical to the metal layer used to form the gate line GL1 to GLn formed in the display area DA.

A first insulation layer 102 is formed on the power connecting wiring 142 and the clock connecting wiring 145 that are formed from the first metal layer. The first insulation layer 102 may be further formed on exposed portions of the base substrate 101. For example, the first insulation layer 102 is a gate insulation layer formed on the gate line GL1 to GLn.

The start wiring 146 including the first, second and third wiring 146*a*, 146*b* and 146*c* is formed from a second metal layer on the first insulation layer 102. A second insulation layer 104 is formed on the base substrate 101 having the first insulation layer 102 and the start wiring 146 formed thereon. For example, the second insulation layer 104 may be a passivation layer formed on the data line DL.

The second and third wirings 146*b* and 146*c* are crossed with the power connecting wiring 142 and the clock connecting wiring 145. A plurality of capacitors C1, . . . , Cn is formed on the crossed portions, which includes the first metal layer, the first insulation layer 102 and the second metal layer. In FIGS. 2 to 4, the capacitors C1, . . . , Cn are formed in correspondence with 'n' numbers of stages SRC1, SRCn, and are connected in parallel to the start wiring 146.

Accordingly, as shown in FIG. 4, when static electricity 'Q', which is generated during a manufacturing process of a display substrate and an array test process, is applied to a start test pad 211, the static electricity 'Q' is dispersed in the capacitors C1, . . . , Cn that are connected in parallel to the start wiring 146, so that a charging quantity that is charged in each capacitor C1, . . . , Cn is Q/n. Therefore, an energy of the static electricity applied to the stages SRC1, . . . , SRCn is decreased, thereby preventing damage to the first stage SRC1 and the (n)-th stage SRCn.

Hereinafter, various other exemplary embodiments for the gate drive circuit will be described. The gate drive circuits according to the various other exemplary embodiments are substantially the same as the gate drive circuit of the first exemplary embodiment except for at least a signal pad part and a signal wiring part. Thus, identical reference numerals are used in the following drawings to refer to components that are the same or like those shown in FIGS. 1 to 4, and thus, a detailed description thereof will be omitted.

Figure 5:
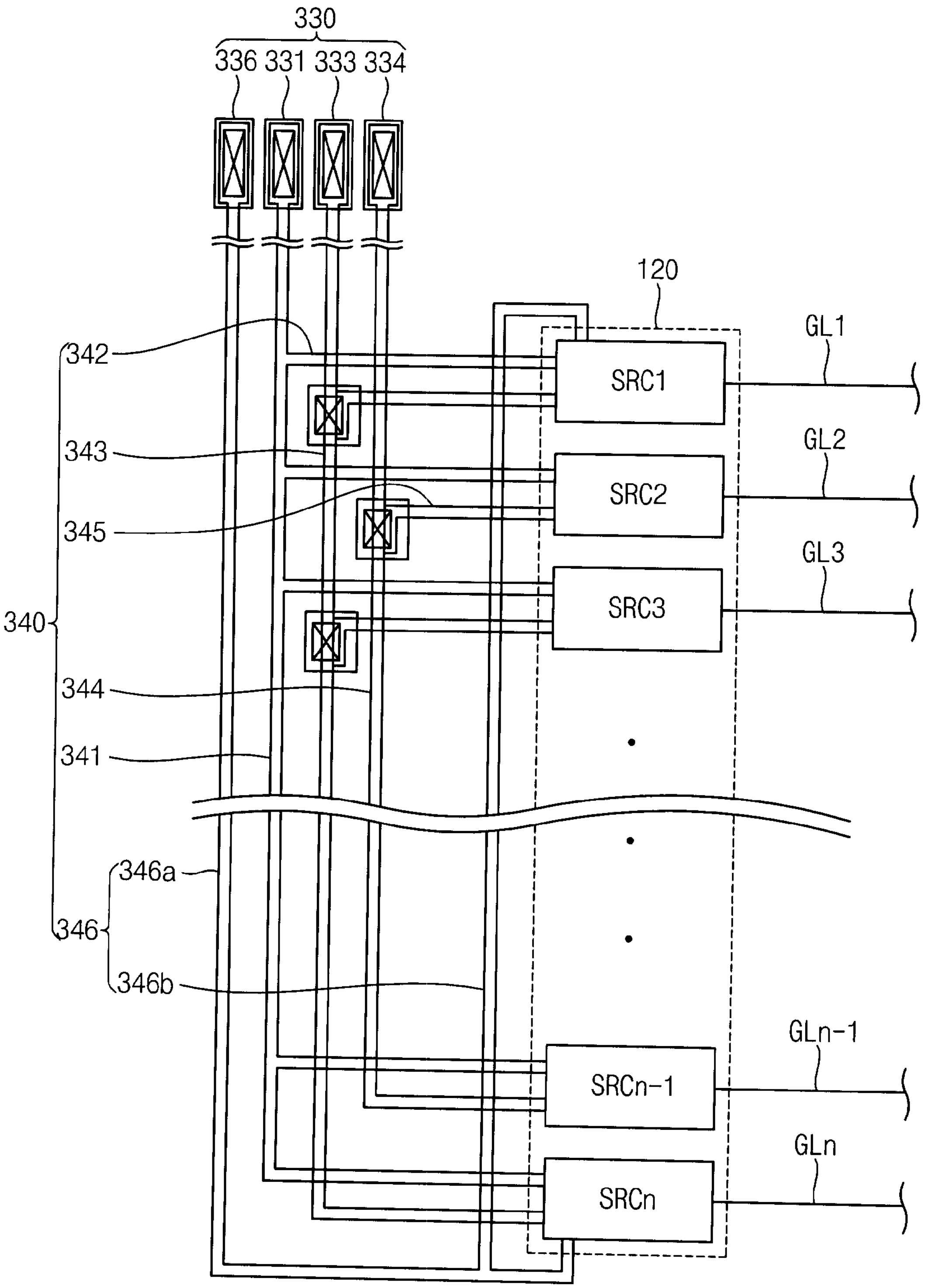
FIG. 5 is an enlarged view illustrating the exemplary gate drive circuit according to another exemplary embodiment of the present invention.

FIG. 5 is an enlarged view illustrating the exemplary gate drive circuit according to another exemplary embodiment of the present invention.

Referring to FIG. 5, a gate drive circuit includes a shift register 120, a signal pad part 330 and a signal wiring part 340. The signal pad part 330 includes a power pad 331, a first clock pad 333, a second clock pad 334 and a start pad 336.

The signal wiring part 340 includes a power wiring 341 connected to the power pad 331, first and second clock wirings 343 and 344 connected to the first and second clock pads 333 and 334, respectively, and a start wiring 346 connected to the start pad 336. The signal wiring part 340 further includes a plurality of power connecting wirings 342 connected to the power wiring 341, and a plurality of clock connecting wirings 345 connected to the first and second clock wirings 343 and 344.

The start wiring 346 includes a first wiring 346*a* adjacent to the power wiring 341 and extended along the first direction, and a second wiring 346*b* formed between the first and second clock wirings 343 and 344 and the shift register 120 and also extended toward the first direction. The first wiring 346*a* may be connected to the second wiring 346*b* by a connecting wiring that extends in the second direction and that is disposed adjacent an end of the display substrate adjacent to the (n)-th stage SRCn.

For example, the first wiring 346*a* is formed in a first side opposite to a second side of the power wiring 341, where the first and second clock wirings 343 and 344 are formed adjacent to the second side of the power wiring 341, and is extended from the start pad 336 to an (n)-th stage SRCn.

The second wiring 346*b* is crossed with the power connecting wiring 342 and the clock connecting wiring 345. The second wiring 346*b* is connected to the first wiring 346*a*, and is extended from the (n)-th stage SRCn to the first stage SRC1 so that a first end terminal of the second wiring 346*b* is connected to an input terminal of the first stage SRC1 and a second end terminal of the second wiring 346*b* is connected to an input terminal of the (n)-th stage SRCn. Therefore, the vertical start signal STV applied to the start pad 336 is provided to the first and (n)-th stages SRC1 and SRCn.

A plurality of capacitors is formed in crossed portions between the second wiring 346*b*, the power connecting wiring 342 and the clock connecting wiring 345. Therefore, static electricity applied to the start wiring 346 is dispersed by the capacitors, thereby preventing damage to the shift register 120.

Figure 6:
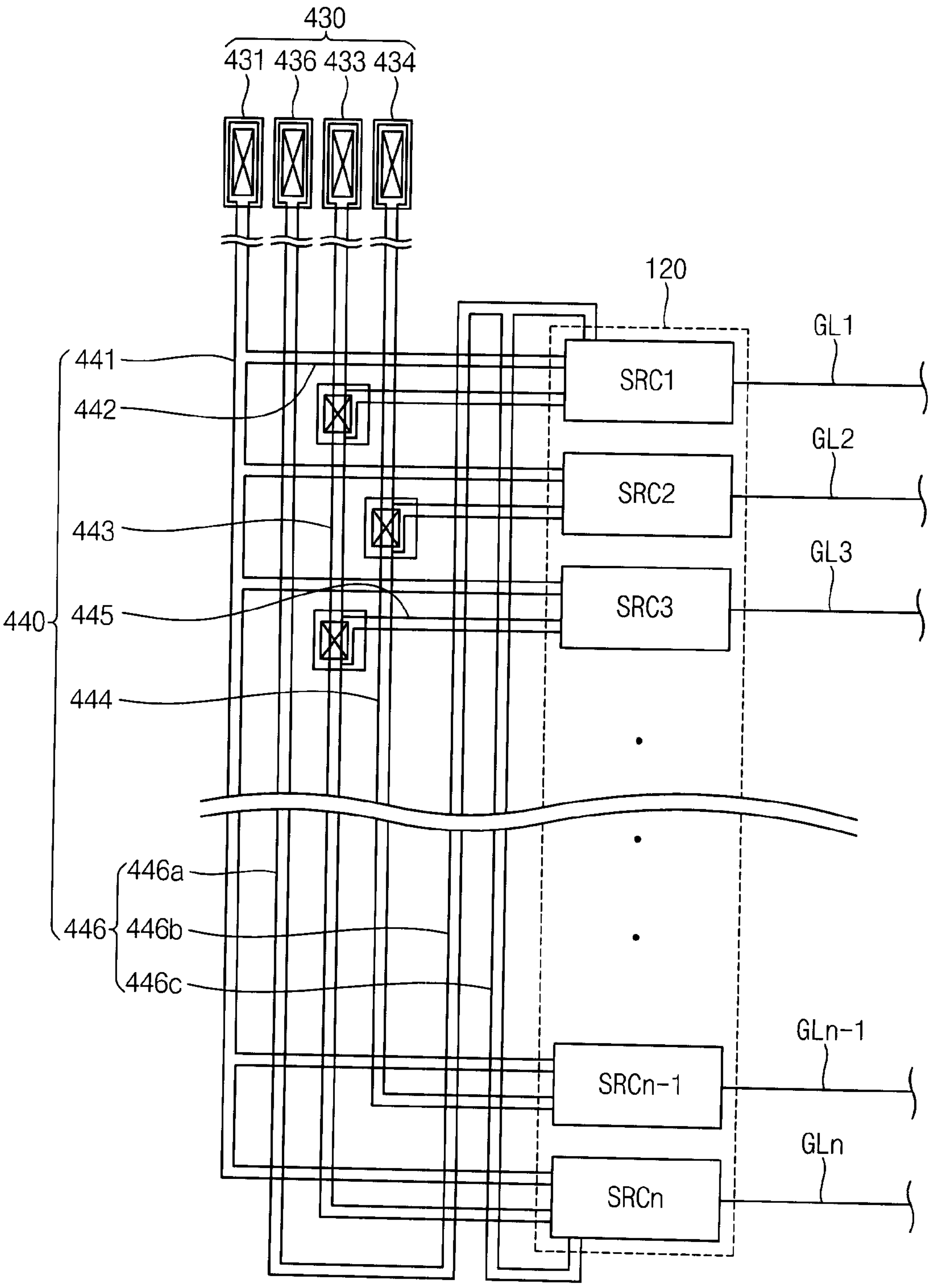
FIG. 6 is an enlarged view illustrating the exemplary gate drive circuit according to still another exemplary embodiment of the present invention.

FIG. 6 is an enlarged view illustrating the exemplary gate drive circuit according to still another exemplary embodiment of the present invention.

Referring to FIG. 6, the gate drive circuit includes a shift register 120, a signal pad part 430 and a signal wiring part 440. The signal pad part 430 includes a power pad 431, a first clock pad 433, a second clock pad 434 and a start pad 436.

The signal wiring part 440 includes a power wiring 441 connected to the power pad 431, first and second clock wirings 443 and 444 connected to the first and second clock pads 433 and 434, and a start wiring 446 connected to the start pad 436. The signal wiring part 440 further includes a plurality of power connecting wirings 442 connected to the power wiring 441, and a plurality of clock connecting wirings 445 connected to the first and second clock wirings 443 and 444.

The start wiring 446 includes a first wiring 446*a* formed between the power wiring 441 and the first and second clock wirings 443 and 444, and a second wiring 446*b* formed between the first and second clock wirings 443 and 444 and the shift register 120. The first and second wirings 446*a* and 446*b* may be connected to each other by a connecting wiring extending in the second direction and disposed adjacent an end of the display substrate adjacent to the (n)-th stage SRCn.

For example, the first wiring 446*a* is extended from the start pad 436 to the (n)-th stage SRCn, and the second wiring 446*b* is connected to the first wiring 446*a* and is extended to the first stage SRC1 to be connected to an input terminal of the first stage SRC1. The third wiring 446*c* is connected to the second wiring 446*b* and is extended from the first stage SRC1 to the (n)-th stage SRCn to be connected to an input terminal of the (n)-th stage SRCn. Therefore, the vertical start signal STV applied to the start pad 436 is provided to the first and (n)-th stages SRC1 and SRCn.

A plurality of capacitors is formed in crossed portions between the second and third wirings 446*b* and 446*c*, the power connecting wiring 442 and the clock connecting wiring 445. Therefore, static electricity applied to the start wiring 446 is dispersed by the capacitors, thereby preventing damage to the shift register 120.

In this exemplary embodiment, the start wiring 446 includes the first, second and third wirings 446*a*, 446*b* and 446*c*. Alternatively, the start wiring 446 may include the first and second wirings 446*a* and 446*b* but not the third wiring 446*c*, similar to the second exemplary embodiment shown in FIG. 5 that employs first and second wirings 346*a* and 346*b*. That is, a first end terminal of the second wiring 446*b* may be connected to an input terminal of the first stage SRC1, and a second end terminal of the second wring 446*b* may be connected to an input terminal of the (n)-th stage SRCn.

Figure 7:
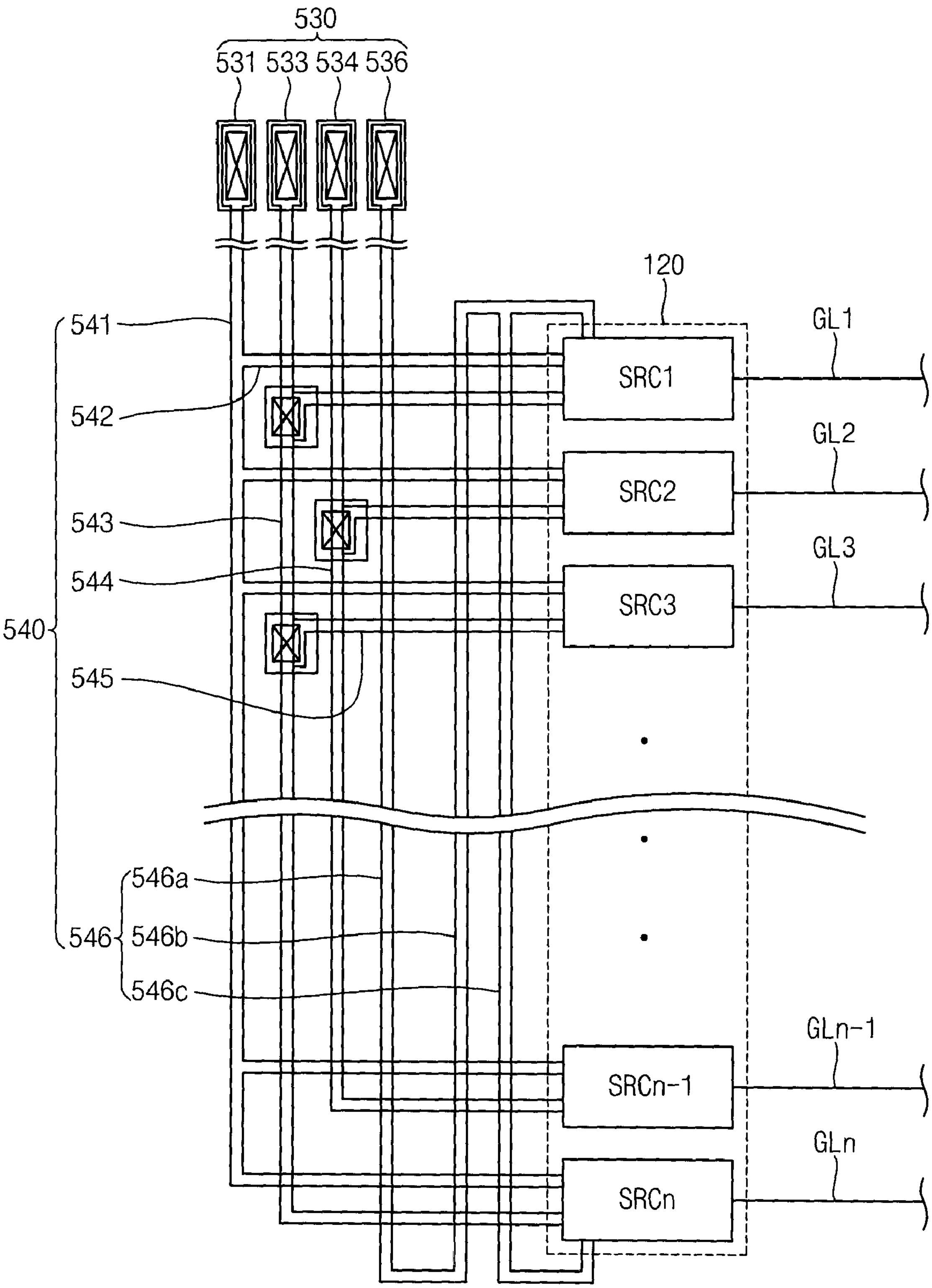
FIG. 7 is an enlarged view illustrating the exemplary gate drive circuit according to yet another exemplary embodiment of the present invention.

FIG. 7 is an enlarged view illustrating the exemplary gate drive circuit according to yet another exemplary embodiment of the present invention.

Referring to FIG. 7, a gate drive circuit includes a shift register 120, a signal pad part 530 and a signal wiring part 540. The signal pad part 530 includes a power pad 531, a first clock pad 533, a second clock pad 534 and a start pad 536.

The signal wiring part 540 includes a power wiring 541 connected to the power pad 531, first and second clock wirings 543 and 544 connected to the first and second clock pads 533 and 534, respectively, and a start wiring 546 connected to the start pad 536. The signal wiring part 540 further includes a power connecting wiring 542 connected to the power wiring 541, and a clock connecting wiring 545 connected to the first and second clock wirings 543 and 544.

The start wiring 546 includes first, second and third wirings 546*a*, 546*b* and 546*c* that are formed between the first and second clock wirings 543 and 544 and the shift register 120, and are in parallel with each other. The first and second wirings 546*a* and 546*b* may be connected to each other may be connected to each other by a connecting wiring that extends in the second direction and that is disposed adjacent to an end of the display substrate that is adjacent to the (n)-th stage SRCn.

For example, the first wiring 546*a* is extended from the start pad 536 to the (n)-th stage SRCn, and the second wiring 546*b* is connected to the first wiring 546*a* and is extended from the (n)-th stage SRCn to the first stage SRC1 to be connected to an input terminal of the first stage SRC1. The third wiring 546*c* is connected to the second wiring 546*b* and is extended from the first stage SRC1 to the (n)-th stage SRCn to be connected to an input terminal of the (n)-th stage SRCn. Therefore, the vertical start signal STV applied to the start pad 536 is provided to the first and (n)-th stages SRC1 and SRCn.

A plurality of capacitors is formed in crossed portions between the first, second and third wirings 546*a*, 546*b* and 546*c*, the power connecting wiring 542 and the clock connecting wiring 545. Therefore, static electricity applied to the start wiring 546 is dispersed by the capacitors, thereby preventing damage to the shift register 120.

In this exemplary embodiment, the start wiring 546 includes the first, second and third wirings 546*a*, 546*b* and 546*c*. Alternatively, the start wiring 546 may include the first and second wirings 546*a* and 546*b* but not the third wiring 546*c*, similar to the second exemplary embodiment shown in FIG. 5 that employs first and second wirings 346*a* and 346*b*. That is, a first end terminal of the second wiring 546*b* may be connected to an input terminal of the first stage SRC1, and a second end terminal of the second wring 546*b* may be connected to an input terminal of the (n)-th stage SRCn.

As described above, in a gate drive circuit according to the present invention, a structure of a signal wiring part delivering a vertical start signal is changed, thereby protecting the gate drive circuit from static electricity.

For example, a start wiring delivering a vertical start signal is crossed with other wirings, so that a plurality of capacitors is formed on crossed portions. Thus, static electricity applied to the start wiring is dispersed through the capacitors, thereby decreasing energy of static electricity applied to a shift register. Therefore, the shift register, for example, a first stage, is prevented from being damaged by the static electricity, so that a driving reliability of a gate drive circuit may be enhanced.

Although exemplary embodiments of the present invention have been described, it is understood that the present invention should not be limited to these embodiments but various changes and modifications can be made by one of ordinary skill in the art within the spirit and scope of the present invention as hereinafter claimed.

What is claimed is:

1. A gate drive circuit comprising:

a shift register including a plurality of stages arranged in a first direction on a base substrate to output a plurality of gate signals;

a clock wiring extended along the first direction, the clock wiring electrically connected to a plurality of clock connecting wirings extended in a second direction crossing the first direction to deliver a clock signal to the stages; and a start wiring including a first wiring extended along the first direction and a second wiring connected to the first wiring and extended along the first direction to cross with the clock connecting wirings so as to deliver a vertical start signal to a first stage among the stages, wherein capacitors are formed where the second wiring of the start wiring crosses the clock connecting wirings, and static electricity applied to the start wiring is dispersed through the capacitors to decrease energy of static electricity applied to the shift register.

2. The gate drive circuit of claim 1, further comprising a power wiring extended along the first direction, the power wiring connected to a plurality of power connecting wirings extended along the second direction to deliver a power signal to the stages.

3. The gate drive circuit of claim 2, wherein the second wiring of the start wiring crosses with the power connecting wirings and the clock connecting wirings.

4. The gate drive circuit of claim 2, wherein the clock wiring is formed adjacent a first side of the power wiring, and the first wiring of the start wiring is formed adjacent a second side of the power wiring opposite to the first side of the power wiring, such that the power wiring is formed between the clock wiring and the first wiring of the start wiring.

5. The gate drive circuit of claim 4, wherein the start wiring further comprises a third wiring extended from the second wiring to deliver the vertical start signal to a last stage among the stages, the third wiring crossing at least one of the clock connecting wirings and the power connecting wirings.

6. The gate drive circuit of claim 5, wherein the second and third wirings are formed from a metal layer that is different from the clock connecting wirings and the power connecting wirings.

7. The gate drive circuit of claim 2, wherein the first wiring is formed between the clock wiring and the power wiring to cross with at least one of the clock connecting wirings and the power connecting wirings.

8. The gate drive circuit of claim 7, wherein the start wiring further comprises a third wiring extended from the second wiring to deliver the vertical start signal to a last stage among the stages, the third wiring crossing at least one of the clock connecting wirings and the power connecting wirings.

9. The gate drive circuit of claim 8, wherein the first and second wirings are formed from a metal layer that is different from the clock connecting wirings and the power connecting wirings.

10. The gate drive circuit of claim 1, wherein the clock wiring comprises:

a first clock wiring delivering a first clock signal to odd stages through the clock connecting wirings; and a second clock wiring delivering a second clock signal having a phase opposite to the first clock signal to even stages through the clock connecting wirings.

11. The gate drive circuit of claim 1, wherein the start wiring further comprises a third wiring extended from the second wiring to deliver the vertical start signal to a last stage among the stages, the third wiring crossing the clock connecting wirings.

12. A display substrate comprising:

a plurality of pixel parts formed in a display area of a base substrate, the pixel parts electrically connected to a plurality of data lines extended along a first direction and a plurality of gate lines extended along a second direction crossing the first direction; and a gate drive circuit comprising:

a shift register formed in a peripheral area surrounding the display area, the shift register including a plurality of stages to output a plurality of gate signals;

a clock wiring electrically connected to a plurality of clock connecting wirings extended along the second direction to deliver a clock signal to the stages; and a start wiring including a first wiring extended along the first direction and a second wiring connected to the first wiring and extended along the first direction to cross with the clock connecting wirings so as to deliver a vertical start signal to a first stage among the stages, wherein capacitors are formed where the second wiring of the start wiring crosses the clock connecting wirings, and static electricity applied to the start wiring is dispersed through the capacitors to decrease energy of static electricity applied to the shift register.

13. The display substrate of claim 12, further comprising a power wiring extended along the first direction, the power wiring connected to a plurality of power connecting wirings extended along the second direction to deliver a power signal to the stages.

14. The display substrate of claim 13, wherein the clock wiring is formed adjacent a first side of the power wiring, a first wiring of the start wiring formed adjacent a second side of the power wiring opposite to the first side of the power wiring, such that the power wiring is formed between the clock wiring and the first wiring of the start wiring.

15. The display substrate of claim 14, wherein the start wiring further comprises a third wiring extended from the second wiring to deliver the vertical start signal to a last stage among the stages, the third wiring crossing at least one of the clock connecting wirings and the power connecting wirings.

16. The display substrate of claim 15, wherein the second and third wirings are formed from a metal layer that is different from the clock connecting wirings and the power connecting wirings.

17. The display substrate of claim 13, wherein the first wiring is formed between the clock wiring and the power wiring to cross with at least one of the clock connecting wirings and the power connecting wirings.

18. The display substrate of claim 17, wherein the start wiring further comprises a third wiring extended from the second wiring to deliver the vertical start signal to a last stage among the stages, the third wiring crossing at least one of the clock connecting wirings and the power connecting wirings.

19. The display substrate of claim 18, wherein the first and second wirings are formed from a metal layer that is different from the clock connecting wirings and the power connecting wirings.

20. The display substrate of claim 12, wherein the clock wiring comprises:

a first clock wiring delivering a first clock signal to odd stages through the clock connecting wirings; and a second clock wiring delivering a second clock signal having a phase opposite to the first clock signal to even stages through the clock connecting wirings.

21. A method of enhancing a driving reliability of a gate drive circuit, the gate drive circuit including a shift register including a plurality of stages arranged in a first direction on a base substrate to output a plurality of gate signals, and a clock wiring extended along the first direction, the clock wiring electrically connected to a plurality of clock connecting wirings extended in a second direction crossing the first direction to deliver a clock signal to the stages, the method comprising:

providing a start wiring to deliver a vertical start signal to a first stage among the stages, the start wiring including a first wiring extended along the first direction and a second wiring connected to the first wiring and extended along the first direction; and crossing the second wiring of the start wiring with the clock connecting wirings;

wherein capacitors are formed where the second wiring crosses the clock connecting wirings, and static electricity applied to the start wiring is dispersed through the capacitors to decrease energy of static electricity applied to the shift register.

* * * * *